Figure 1:
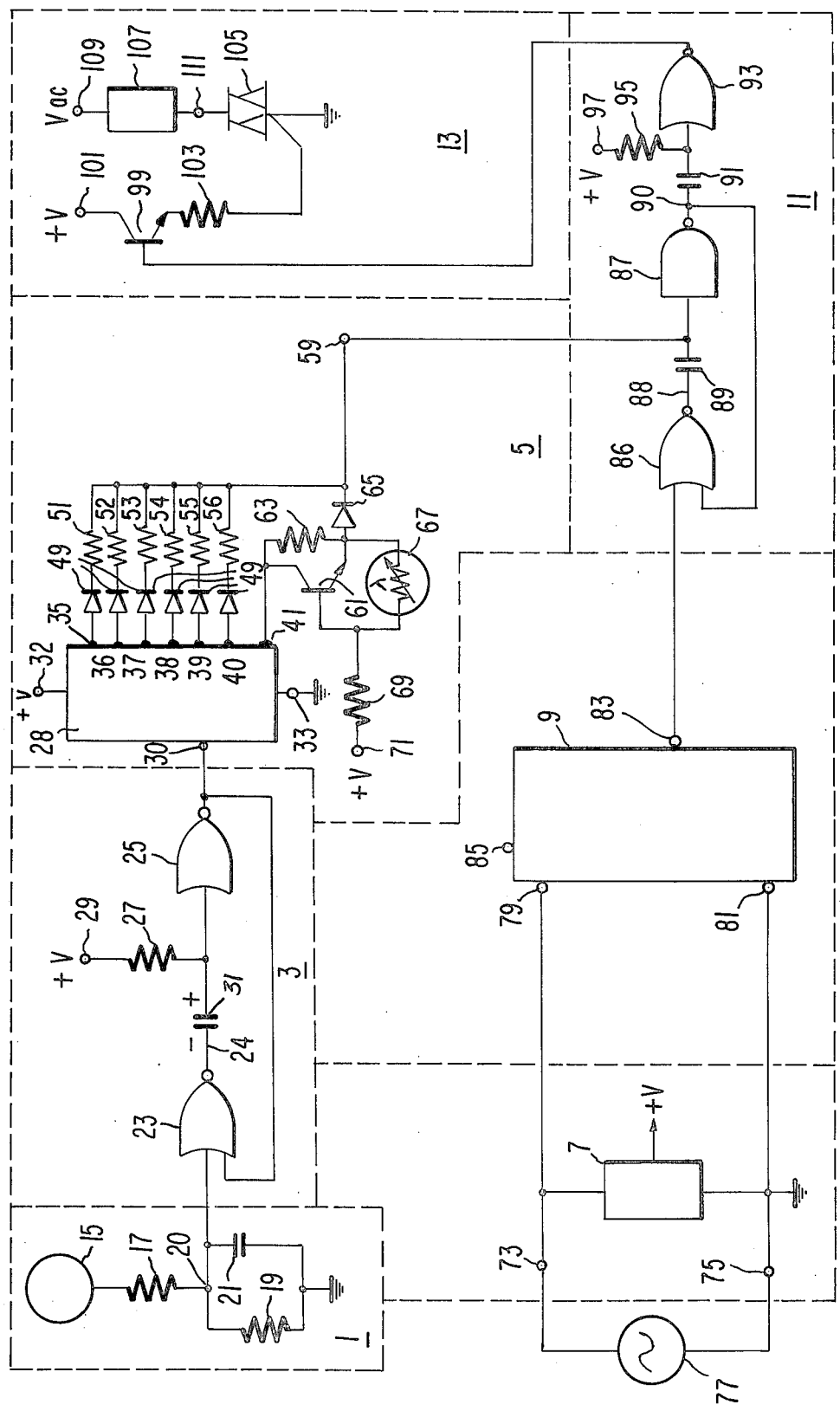

2025-01-22

United States Patent [19]

Petrizio

[11] 4,119,864
[45] Oct. 10, 1978

[54] TOUCH SWITCH CIRCUITS

[75] Inventor: Cesare James Petrizio, Flanders, N.J.

[73] Assignee: RCA Corporation, New York, N.Y.

[21] Appl. No.: 716,539

[22] Filed: Aug. 23, 1976

[51] Int. Cl.² .............................................. H01H 35/00
[52] U.S. Cl. ....................................... 307/116; 328/5; 361/181
[58] Field of Search ........... 340/258 B, 258 C, 365 C; 328/5; 307/116, 117, 118, 308; 361/181; 200/DIG. 1, DIG. 2

[56] References Cited

U.S. PATENT DOCUMENTS

| 3,811,054 | 5/1974 | Wern et al. | 307/252 H |
|---|---|---|---|
| 3,829,705 | 8/1974 | Richter | 307/116 |
| 3,857,100 | 12/1974 | Baars | 307/116 |
| 4,016,428 | 4/1977 | Gutterman | 307/116 |

Primary Examiner—Robert K. Schaefer
Assistant Examiner—Michael K. Mutter
Attorney, Agent, or Firm—H. Christoffersen; J. M. O'Meara; A. L. R. Limberg

[57] ABSTRACT

In one embodiment, the amount of power delivered to a load depends upon the length of time a touch switch is actuated or on the number of times it is actuated. In a second embodiment, the power delivered to a load starts at one level and smoothly changes to a second level. Both embodiments include a zero-crossover detector, an a.c. operated load, and a circuit responsive both to zero-crossover pulses and to a circuit actuated by the touch switch for controlling the portion during each half period of the a.c. during which power is applied to the load.

8 Claims, 2 Drawing Figures

TOUCH SWITCH CIRCUITS

The present invention relates to touch switch circuits.

Circuits known as "touch switch" circuits include a conductor, such as a metal plate, responsive to the human touch, for turning on or off a load such as a lamp or motor. Such circuits may depend for their operation on a change in capacitance between the conductor and ground, or on the injection of an a.c. hum signal. Some of the known touch circuits also permit the selective application of a desired amount of power to a load, in response to successive momentary touchings or to the continuous touching of the touch plate conductor. However, they tend to be rather complex in terms of number of components and design.

The present invention relates to circuits of the latter type of improved and relatively simplified design.

Figure 2:
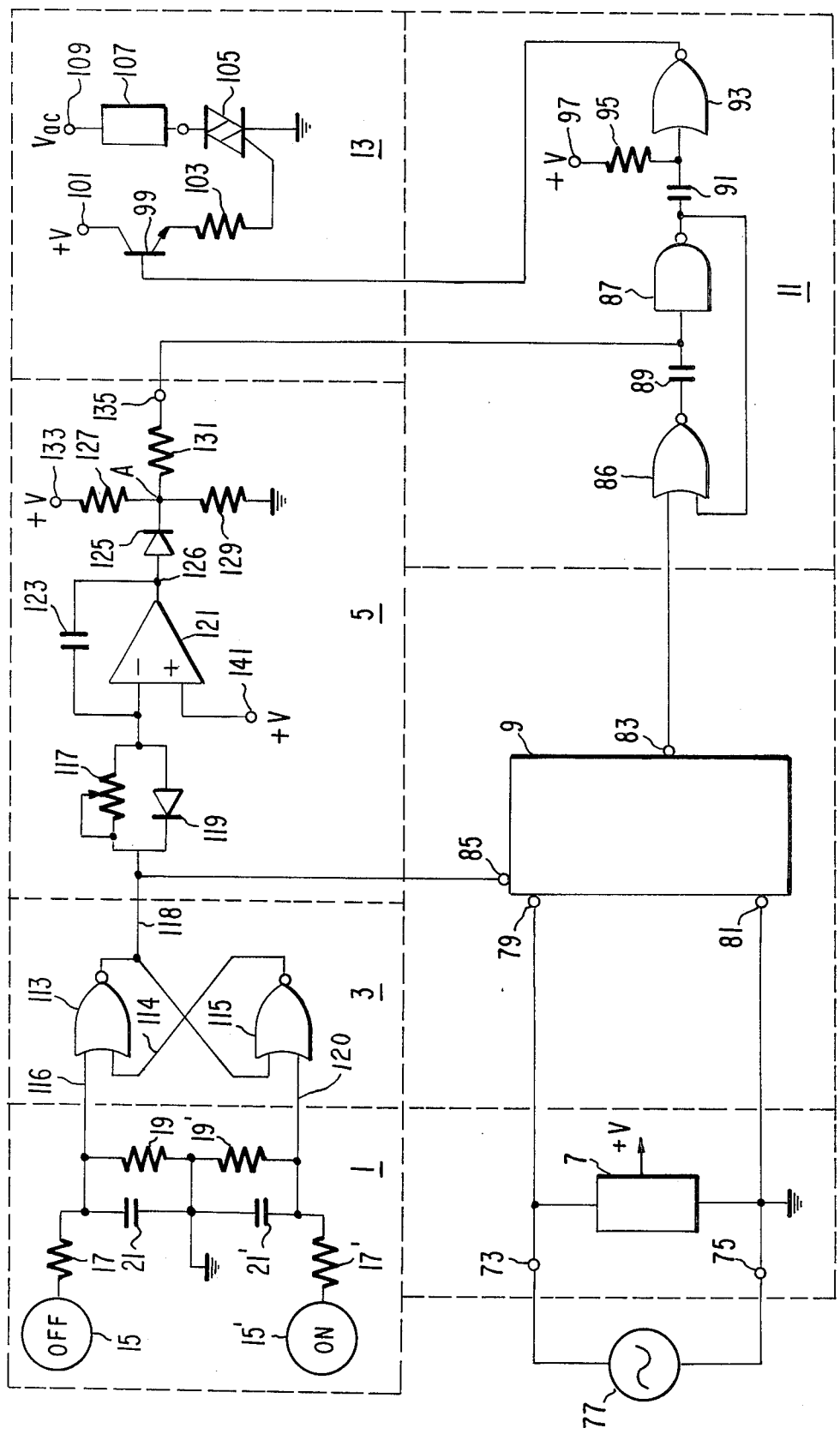

In the drawing:

FIGS. 1 and 2 are circuit diagrams of two embodiments of the invention.

Like reference symbols designate like elements in the two FIGURES.

In FIG. 1, the touch plate network 1 includes a touch plate 15 coupled by a resistor 17 to the common connection 20 of a resistor 19 and capacitor 21. The resistor 19 and capacitor 21 are connected at their other terminal to a point of reference potential, ground in this example.

The network 3 is a monostable multivibrator including a NOR gate 23 having one input terminal connected to the common connection 20 and another input terminal connected to the output terminal of NOR gate 25 (which operates as an inverter). The output terminal of NOR gate 23 is connected to the input terminal of NOR gate 25 via capacitor 31. Operating voltage terminal 29 is connected through resistor 27 to the input terminal of NOR gate 25.

The control network 5 includes a decade counter 28 having an input terminal 30 connected to the output terminal of NOR gate 25, a power terminal 32 to which a voltage +V may be applied, another power terminal 33 for connection to ground, and a plurality of output terminals (seven in this example) 35-41. The decade counter may be an integrated circuit such as the CD 4017 made by RCA Corp.. The anode electrodes of six like diodes 49 are connected to six of the output terminals 35-40, respectively. The cathode electrodes of the diodes 49 are connected to six resistors 51-56, respectively. These resistors are connected at their other end to an output terminal 59 of the control network 5. A light responsive network of this control network 5 includes a transistor 61 having an emitter electrode coupled via a resistor 63 to the common connection of its collector electrode and output terminal 41 of decade counter 28, and via a diode 65 poled in the same direction as the emitter-base junction to output terminal 59. The base electrode of NPN transistor 61 is coupled via a photoresistor 67 to its emitter electrode, and via a resistor 69 to a power terminal 71 for connection to the positive voltage +V.

A pair of input terminals 73 and 75 are included for connection to an external source of a.c. voltage 77. A positive voltage supply 7 for providing the voltage +V may be connected between the input terminals 73 and 75. Of course, the positive voltage +V may be supplied externally if desired. A zero-crossover detector 9, chosen from among any suitable one of many known such detectors, has input terminals 79 and 81 connected to input terminals 73 and 75, respectively. An output terminal 83 of zero-crossover detector 9 is connected to the delay multivibrator network 11, as will be described. The zero-crossover detector 9 also includes a control terminal 85, for use in the embodiment of FIG. 2, as will be described.

The delay multivibrator network 11 includes a NOR gate 86 having one input terminal connected to output terminal 83 of the zero-crossover detector 9, and another input terminal connected to the output terminal of a NAND gate 87 (operating as an inverter), and an output terminal coupled via a timing capacitor 89 both to an input terminal of NAND gate 87 and the output terminal 59 of control network 5. The output terminal of NAND gate 87 is also connected via another timing capacitor 91 to the common connection of an input terminal of a NOR gate 93 and one end of a resistor 95, the other end of which is connected to a power terminal 97 to which the voltage +V may be applied. The output terminal of NOR gate 93 is connected to switching network 13. It should be noted that the delay multivibrator network 11 includes two monostable multivibrators. One comprises NOR gate 86, capacitor 89, and NAND gate 87, in combination with the output impedance at terminal 59 of control network 5; the other comprises NOR gate 93, capacitor 91, and resistor 95.

The switching network 13 includes an NPN transistor 99 having a base electrode connected to the output terminal of NOR gate 93 of delay multivibrator network 11, a collector electrode connected to a power terminal 101 for connection to the voltage +V, and an emitter electrode coupled via a resistor 103 to the gate electrode of a triac 105. A load 107, such as a motor or light source, for example, is connected between a pair of output terminals 109 and 111 for the touch circuit. The triac 105 has its main conduction path connected between terminal 111 and ground. The a.c. voltage from a.c. source 77 is applied between output terminal 109 and ground.

The touch plate network 1 of FIG. 2 includes two networks, each identical to the touch plate network 1 of FIG. 1. One is identified by the same reference numerals as used in FIG. 1, the other by the same reference numerals primed. The multivibrator network 3 is a bistable multivibrator or flip-flop, comprising cross-connected NOR gates 113, 115.

The control network of 5 of FIG. 2 includes a variable resistor 117 having an arm and one terminal connected in common both to the cathode electrode of a diode 119 and to the output terminal of network 3. The other terminal of variable resistor 117 is connected in common to both the anode electrode of diode 119 and to the inverting input terminal of an operational amplifier 121. The output terminal of the latter is coupled by a capacitor 123 to its inverting input terminal, and is connected directly to the anode electrode of a diode 125, the cathode electrode of this diode being connected to the common connection of resistors 127, 129 and 131. The other ends of resistors 127, 129, and 131 are individually connected to a power terminal 133 for connection to a positive voltage +V, to a point of reference potential (ground in this example), and to an output terminal 135 of the control network 5, respectively. The non-inverting input terminal of operational amplifier 121 is connected to a power terminal 141 for connection to the positive voltage +V. The remainder of FIG. 2 is similar to FIG. 1.

In the operation of the circuit of FIG. 1, a touching of touch plate 15 by a human finger, for example, causes a.c. hum (at 60 Hz, assuming this to be the power line frequency) picked up by the human body to be injected into the touch plate network 1. Thus hum appears as an output hum signal across resistor 19 and capacitor 21. Assume that both inputs to gate 23 initially are low so that the output is high (relatively positive). When the positive going portion of the hum signal exceeds the threshold level of NOR gate 23, the voltage at its output terminal 24 will go low, substantially to ground. When the output signal of NOR gate 23 initially goes low, capacitor 31 is essentially discharged, and couples this low signal to the input terminal of NOR gate 25, causing the voltage level at the output terminal of NOR gate 25 to go high, thereby latching the monostable multivibrator in this condition (terminal 30 high, terminal 24 low). The high at terminal 30 advances decade counter 28 one count.

Immediately after the output signal level of NOR gate 23 goes low, capacitor 31 begins taking on charge from the positive voltage +V via resistor 27, and charges to the positive threshold of NOR gate 25. The charging time depends upon the values of capacitor 31, resistor 27, and voltage +V. When the capacitor 31 charges to a level such that the threshold voltage of NOR gate 25 is reached, the output signal from NOR gate 25 switches back to its low level, and the monostable multivibrator becomes reset (assuming the input at 20 is low at this time). If the input at 20 is still high because touch plate 15 is still being touched, or if the plate 15 is momentarily touched at a later time, a new cycle of operation starts. In the former case (continuous actuation of the touch plate), the output signal at 30 appears as a train of pulses, spaced substantially equal intervals from one another. Each pulse causes the decade counter 28 to advance one step. In the latter case, the decade counter 28 advances by one, each time the plate is touched.

Assume that the decade counter 28 is in its initial or inactive state, that is, all of its output terminals 35 through 41 are substantially at ground. In response to the first pulse it receives, a high output signal level, of about +V, appears at output terminal 35. This results in timing resistor 51 being inserted into the timing circuit of the delay multivibrator 11, the delay time of which will be determined by the value of the voltage at output terminal 35 of the decade counter 28, and the values of resistor 51 and timing capacitor 89 of the delay multivibrator 11. In response to the next pulse, the output voltage from output terminal 35 goes low and output terminal 36 goes high. This inserts resistor 52 into the timing circuit. Resistor 52 is of different value than resistor 51 so that it provides a different delay time than resistor 51. The remaining resistors also are of different values for providing different values of delay time. Thus, each time an additional input pulse is received, advancing the counter output voltage from one terminal to the next, in sequence, a different delay is inserted in the signal path. Once the output voltage has been advanced to output terminal 41, the very next input pulse causes the decade counter 28 to return to its initial state-all output terminals 35-41 low. The cycle then repeats in response to additional input pulses.

It is assumed in the discussion above that the values of resistors 51-56 are of increasing value from the lowest numbered resistor 51 to the highest numbered resistor 56. Accordingly, once decade counter 28 is turned on, the delay time of the delay multivibrator network 11 will be increased in value for each advancement of the decade counter 27, in response to successive input pulses from the monostable multivibrator 3. If desired to program the delays in a different way, this can be done by choosing values of resistors 51-56 in accordance with a different rule.

The zero crossover detector 9 produces a positive output pulse at terminal 83 in response to each zero crossover of the a.c. voltage from the a.c. voltage supply 77. So long as decade counter 28 is turned on, as previously described, each such pulse triggers the delay multivibrator network 11 into operation. When counter 28 is on, 59 is high so that the voltage at terminal 90 is low. The delay multivibrator 11 responds to the positive pulse by initially causing the voltage at the output terminal 88 of NOR gate 86 to go from a high level to a low level. Timing capacitor 89 couples this low level voltage to the input terminal of NAND gate 87, causing the output signal level of NAND gate 87 to go from a low level to a high level for latching the output state of NOR gate 86 in a low level condition.

Immediately after the output voltage from NOR gate 86 goes low, timing capacitor 89 will begin taking on a positive charge from +V via one of the timing resistors 51-56, inserted into the timing circuit as previously described, or via the resistor or resistance provided by the light sensitive circuit including transistor 61, as will be described (the output voltage of decade counter 28 having been advanced to its output terminal 41). When capacitor 89 charges to a level such that the threshold voltage of NAND gate 87 is reached, it changes state and the output at 90 goes low. Assuming the output at 83 also to be low, terminal 88 goes high and the monostable multivibrator (86, 87, 89) is reset.

Summarizing, in part, each time the a.c. source 77 has a zero crossing, the monostable multivibrator is triggered on and the voltage at terminal 90 goes high. The multivibrator returns to its initial state within one-half cycle of the a.c.0 or low representing ground), for terminals 35-41, respectively, the multivibrator is reset a short time after it is set. If the count is higher, such as 0000100 (terminal 39 being high, 35-38 and 40-41 being low), the multivibrator is reset a longer time after the start of a cycle. The time at which the multivibrator 11 is reset, determines the time at which the triac 105 turns on and applies power to the load 107, as will be explained next. If it is turned on earlier in the half cycle of the a.c. as would be the case for a low count, power is applied to the load for a larger portion of each half cycle of the a.c. and vice versa, as explained below.

When the output signal from NAND gate 87 initially goes low upon reset of the multivibrator (substantially to ground), this low level signal is coupled via timing capacitor 91 to the input terminal of NOR gate 93, causing the output signal from NOR gate 93 to now go high, turning on transistor 99. This causes a flow of current via the collector-emitter path of transistor 99 and resistor 103 to the gate electrode of triac 105, turning on the triac. The output signal from NOR gate 93 is a very narrow pulse, the width of which is determined by the charging of capacitor 91 via the charging path from the positive voltage +V, including resistor 95 and the output impedance of NAND gate 87. Capacitor 91 will charge positively with respect to the input terminal of NOR gate 93, to the threshold of this NOR gate, at which point the output signal of NOR gate 93 will go low, turning off transistor 99. Values of the positive voltage +V, resistor 95, and capacitor 91 are such as to insure that the output pulse produced by NOR gate 93 goes low well before the end of the half cycle of the a.c. voltage being applied from the load 107 (which is the same a.c. voltage as produced at 77). Even though this turns off transistor 99, the triac 105 remains in conduction for the remainder of the present half cycle of the a.c. voltage. The triac 105 turns off when the value of the a.c. current approaches zero.

The length of time that the triac 105 is energized during any particular half cycle of the a.c. voltage is inversely proportional to the delay time of the delay multivibrator 11. If the output voltage from the decade counter 28 is at its output terminal 35, the delay time of the delay multivibrator network 11 will be relatively short, in that the resistance of resistor 51 is lower than the resistance value of the other resistors 52–56. This means that once triggered by a zero crossing pulse, the delay multivibrator network 11 will turn on transistor 99 early in a particular half cycle of the a.c. voltage, causing a large portion of the a.c. signal of this particular half cycle to be applied to the load 107, or a maximum amount of power to be applied to the load. Contrariwise, if the decade counter 28 has been advanced to the point where it is providing an output voltage at output terminal 40, timing resistor 56 is now inserted in the timing circuit of the delay multivibrator network 11, and since resistor 56 has a substantially higher value of resistance than resistor 51, the delay time for the multivibrator network 11 will be substantially longer than that for resistor 51. Accordingly, this longer delay time will cause transistor 99 to be turned on much later in the particular half cycle of the a.c. voltage after the last zero crossover signal, for turning on triac 105. Accordingly, a minimum level of power is applied to the load 107 (a smaller portion of the half cycle of the voltage will be applied across the load 107). The diodes 49 and 65, are isolation diodes, preventing interaction between activated output terminals of the decade counter 28, and its inactive output terminals.

If decade counter 27 is advanced to provide an output voltage at its output terminal 41, the delay time of the delay multivibrator network 11 will be controlled by the light responsive circuit including transistor 61 and photoresistor 67. If the ambient light level is relatively high, the resistance of the photoresistor 67, which is inversely proportional to the level of the ambient light, will be at a relatively low value of resistance, causing transistor 61 to be nonconductive. As the ambient light level decreases, the value of photoresistor 67 will increase, causing the voltage across the base-emitter junction of the transistor 61 to increase, turning on transistor 61 and controlling its conductivity in inverse relation to the level of ambient light. As the conductivity of transistor 61 so increases, the resistance between its collector-emitter electrodes in parallel with resistor 63 will decrease, causing the total resistance of the parallel combination to correspondingly decrease, in turn causing the delay time of the delay multivibrator 11 to correspondingly decrease. Thus, assuming the load 107 to be a source of light for illuminating a room and the photoresistor 67 to be located outside the window, the source will produce light of an intensity inversely proportional to the outside light.

In the quiescent condition of the circuit, the count stored is all zeros (all terminals 35–41 low), 59 is substantially at ground, and 90 is high. This makes output terminal 88 low. In this condition, the positive input pulses at 83 have no effect on circuit 11. Gate 93 produces a low output in view of the high voltage level +V at terminal 97. The output of NOR gate 93 therefore is low, transistor 99 is off maintaining triac 105 off and no power is applied to the load 107.

In the embodiment of FIG. 1, the amount of power applied to the load 107 is selectively programmable. Touch plate 15 can be momentarily touched to advance decade counter 28 one count per touch, or can be continuously touched to advance the count at a fixed rate. In either case, the decade counter 28 is advanced until a count is reached which corresponds to the desired amount of power to the load (in the case of a lamp, for example, the desired brightness for the lamp).

In the operation of the embodiment of FIG. 2, assume initially that the circuit has been placed in the off condition. This is accomplished by touching touch plate 15, causing a hum signal of sufficient amplitude to be developed across the parallel combination of capacitor 21 and resistor 19, to reset the bistable multivibrator network 3. Assuming the input on lead 114 initially to be low, when lead 116 goes high, a low output signal appears at the output 118 of NOR gate 113, and thus causes a high to appear at 114. The low at 118 causes diode 119 of the ramp generator to become forward biased placing the inverting terminal at ground. The capacitor 123 now charges to the +V level present at output terminal 126 of the amplifier 121.

The low output signal from NOR gate 113 is also applied to the control terminal 85 of the zero-crossover detector circuit 9, to either inhibit or to maintain the zero-crossover detector 9 in an off state, thereby preventing operation of the delay multivibrator 11 and turn on of triac 105.

With the touch plate circuit initially in the off condition, as described above, if touch plate 15' is now touched, a hum signal of sufficient amplitude will be developed at 120 to set the flip-flop 3. That is, NOR gate 115 will be disabled producing a low at 114, and NOR gate 113 will be enabled producing a high at 118. The high output signal at 118 will be at about +V, and will both turn on the zero-crossover detector 9, and cause capacitor 123 to begin initially discharging exponentially into the output impedance of operational amplifier 121. Also, while the output voltage at 126 is greater than the d.c. voltage at A due to resistive divider 127 and 129 (forward biasing diode 125), capacitor 123 will discharge through the paths including resistors 129 and 131, capacitor 89, and the output impedance of NOR gate 86. The initial rate of discharge is determined by the impedance values of the discharge paths just described, including the value of resistor 117. Such discharge causes a negative-going ramp voltage to appear at A, for ramp voltage levels at 126 greater than the d.c. level at A. Variable resistor 117 is used to control the slope of the ramp. When the level of the ramp voltage at 126 decreases to less than the d.c. level at A, diode 125 will become backbiased, with the result that the ramp voltage at A is terminated at this d.c. level. Also, at this time, capacitor 123 will continue to discharge at zero volt, and then begin charging in the opposite direction to about +V, at a rate determined primarily by the value of resistor 117, into the output impedance of amplifier 121.

The delay introduced by delay multivibrator 11 is inversely proportional to the level of voltage at point A. Therefore, the greater the level of voltage at A, the greater the amount of power applied to load 107. Accordingly, with the negatively going ramp voltage at A, successively less power will be applied to the load 107, as the ramp voltage at A, diminishes in value to the d.c. level at A due to divider 127, 129. The decrease in power will in general be smooth, and at a rate inversely proportional to the slope of the ramp, decreasing to a minimum level proportional to the d.c. level at A. If, for example, the load 107 is a light bulb, the bulb will glow brightly, when touch plate 15′ is touched (assuming the circuit initially to be in the "off" state), and then gradually decrease in brightness to some minimum level. Such a circuit is known in the art as a "fade light circuit," or "fade switch." It is useful, for example, in an automatic garage door system.

To recycle the circuit, it is necessary to momentarily touch the touch plate 15, in order to reset the bistable multivibrator of the multivibrator network 3, for charging capacitor 123 back up to +V with respect to the output terminal of operational amplifer 121, as previously described. Thereafter, a momentary touching of touch plate 15′ will cause the circuit operation to be reinitiated for applying a diminishing amount of power to load 107, as previously described.

If desired, the ramp generator of the control network 5 can be modified to provide a ramp signal with a positive slope, that is a signal going from some minimum level of amplitude to a maximum level of amplitude. In such case, a momentary touching of touch plate 15′ will cause power to be applied to the load in an increasing fashion to some maximum power level.

What I claim is:

1. A touch switch circuit for providing individual output signals, each one of which is made to occur a programmable time after the occurrence of each zero-crossing of an a.c. signal, comprising:
   means including a touch plate responsive to the human touch for producing an output signal indicative thereof;
   control means responsive to said output signal, for producing a control signal;
   zero-crossover detector means responsive to said a.c. signal, for producing a first output pulse in response to each zero-crossing of said a.c. signal; and
   delay means reponsive to each output pulse of said zero-crossover detector means for producing a second output pulse which is time delayed with respect to said first output pulse in proportion to the magnitude of said control signal and including;
   a resistive network;
   means responsive to said control signal of said control means for passing current through a selected resistance of said network;
   a charging circuit including the selected resistance and a capacitor;
   a NOR gate having a pair of input terminals, one of which is receptive of said zero-crossing signals, and an output terminal coupled to one end of said capacitor; and
   an inverter having an input terminal connected to the other end of said capacitor and also connected to receive the current supplied through said selected resistance, while the output thereof is connected to the other input terminal of said NOR gate, said inverter producing an output voltage whenever the charge on said capacitor is below a given level.

2. The touch switch circuit of claim 1 wherein said delay means further includes:
   a source of current;
   second charging circuit including a resistor having one end connected to said source of current, and a capacitor connected between the output terminal of said inverter and the other end of said resistor, said capacitor being receptive of charging current from said current source via said resistor, when said output voltage from said inverter is terminated; and
   logic circuit means coupled to the common connection of said resistor and said capacitor of said second charging circuit, for producing an output drive signal whenever the charge on said capacitor of said second charging circuit is below a predetermined level.

3. The touch switch circuit of claim 2, wherein said logic circuit means includes a second inverter having an input terminal connected to the common connection of said resistor and capacitor of said second charging circuit, and an output terminal where said output drive signal is developed.

4. The touch switch circuit of claim 3, further including:
   switching means responsive to said output drive signal, for applying each half-period of a.c. signal across a load over a duration substantially equal to the time period between the initiation of said output drive signal and the next zero crossing of said a.c. signal.

5. The touch switch circuit of claim 4, wherein said switching means includes:
   a d.c. voltage source;
   a transistor having a base electrode receptive of said output drive signal, a collector electrode connected to said d.c. voltage source, and an emitter electrode; and
   bidirectional switching means having a control electrode coupled to said emitter electrode of said transistor, and a main current path connected in a series circuit with said load, said a.c. signal being applied across said series circuit.

6. The touch switch circuit of claim 5, wherein said bidirectional switching means includes a triac having a gate electrode for said control electrode, and said main current path including anode and cathode electrodes.

7. The touch switch circuit of claim 1 wherein said control means includes:
   monostable multivibrator means responsive to actuation of a touch plate for producing a number of relatively narrow, spaced pulses, the number of said pulses depending on the duration of time said touch plate is actuated.

8. The touch switch circuit of claim 7 wherein said selected resistance current passing means includes:
   counter means for producing sequential outputs in response to each said control signal.

* * * * *

UNITED STATES PATENT AND TRADEMARK OFFICE
CERTIFICATE OF CORRECTION

PATENT NO. : 4,119,864

DATED : October 10, 1978

INVENTOR(S) : Cesare James Petrizio

It is certified that error appears in the above-identified patent and that said Letters Patent is hereby corrected as shown below:

Column 4, line 40, after "a.c." insert --The time at which it returns depends on the count stored in the decade counter 28. If the count is low, such as 1000000 (1 or high representing about +V,--.

Column 5, line 41, "27" should be --28--.

Claim 4, line 4, --said-- should be inserted after "of".

Signed and Sealed this

Thirteenth Day of March 1979

[SEAL]

Attest:

RUTH C. MASON
Attesting Officer

DONALD W. BANNER
Commissioner of Patents and Trademarks